(12) United States Patent
Chapman

(10) Patent No.: US 6,376,293 B1
(45) Date of Patent: Apr. 23, 2002

(54) SHALLOW DRAIN EXTENDERS FOR CMOS TRANSISTORS USING REPLACEMENT GATE DESIGN

(75) Inventor: Richard A. Chapman, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/537,271

(22) Filed: Mar. 29, 2000

Related U.S. Application Data
(60) Provisional application No. 60/126,830, filed on Mar. 30, 1999.

(51) Int. Cl.[7] .......................................... H01L 21/8238
(52) U.S. Cl. ..................... 438/199; 438/199; 438/201; 438/222; 438/226; 438/230; 257/69; 257/204
(58) Field of Search ................................ 438/199–233, 438/128–129; 257/69, 204

(56) References Cited

U.S. PATENT DOCUMENTS

| | | | | |
|---|---|---|---|---|
| 5,702,987 A | * | 12/1997 | Chen et al. .................. | 438/187 |
| 5,856,225 A | * | 1/1999 | Lee et al. ..................... | 438/291 |
| 5,955,759 A | * | 9/1999 | Ismail et al. ................. | 257/332 |
| 5,981,344 A | * | 11/1999 | Hshieh et al. ............... | 438/270 |
| 6,093,620 A | * | 7/2000 | Peltzer ........................ | 438/416 |
| 6,127,232 A | * | 10/2000 | Chatterjee et al. ........... | 438/291 |
| 6,180,978 B1 | * | 1/2001 | Chatterjee et al. ........... | 257/327 |
| 6,200,866 B1 | * | 3/2001 | Ma et al. ..................... | 438/299 |

OTHER PUBLICATIONS

Chatterjee et al. "NMOS transistors fabricated by a replacement gate process" IEEE 0–7803–4100–7/97 IEDM 97/821 pp. 33.1.1–33.1.4.*

Sang–Hyun Oh et al. "50nm Vertical replacement–gate pMOSFET" IEEE 0–7803–6438–4/00 IEDM 00–65 pp. 3.6.1–3.6.4.*

* cited by examiner

*Primary Examiner*—Matthew Smith
*Assistant Examiner*—Granvill D Lee, Jr.
(74) *Attorney, Agent, or Firm*—Peter K. McLarty; W. James Brady, III; Frederick J. Telecky, Jr.

(57) ABSTRACT

A method of fabricating a CMOS transistor to construct shallow drain extenders (30) using a replacement gate design. The method involves forming epitaxial layers (30) and (220) the will later function as shallow drain extensions. The etching of the replacement gate (220) and the formation of inner sidewalls (90) serve to define the transistor gate length.

31 Claims, 6 Drawing Sheets

SHALLOW DRAIN EXTENDERS FOR CMOS TRANSISTORS USING REPLACEMENT GATE DESIGN

This application claims priority under 35 USC § 119(e)(1) of provisional U.S. application Ser. No. 60/126,830 filed Mar. 30, 1999.

CROSS-REFERENCE TO RELATED PATENT/PATENT APPLICATIONS

The following co-assigned pending patent applications are hereby incorporated by reference:

| Patent No./Serial No. | Filling Date | TI Case Number | Inventors |
|---|---|---|---|
| 08/957,503 | 10/24/97 | TI-22748 | Rodder et al. |
|  |  | TI-22027 | Rodder et al. |

FIELD OF THE INVENTION

The invention is generally related to the field of MOSFET transistors and more specifically to forming a MOSFET structure using a disposable gate process.

BACKGROUND OF THE INVENTION

As CMOS technology continues to scale further into the sub-micron region, it becomes increasingly difficult to keep sufficiently low gate sheet resistance, low junction capacitance, and low junction depth of source/drain extensions under the gate. As transistors are scaled into the deep sub-micron region, the polysilicon gate linewidths become narrower and narrower. This increases the gate sheet resistance. Achieving low gate sheet resistance becomes difficult even when silicided polysilicon is used. The source/drain junction regions and source/drain extensions must also become shallower to avoid undesired short-channel effects and roll-off of the threshold voltage at short channel lengths. However, in the deep sub-micron region, it is difficult to achieve shallower doping profiles by conventional means such as ion implantation. Therefore, there is a need for a CMOS transistor structure that can be scaled further into the sub-micron region while maintaining sufficiently low gate sheet resistance, small junction depth, and low junction capacitance.

One of the most challenging issues facing the fabrication of sub-micron transistors is forming shallow source/drain extensions under the sidewall spacer. This problem is especially severe for the replacement gate transistor design if inner sidewalls spacers are added to decrease the linewidth of the replacement gate which is formed in the slot in an insulator left by removal of the disposable gate. There are a number of prior art inventions in which a gate is formed in a slot in an insulator by a means other than the removal of the disposable gate. A common problem with these inventions is how to place a shallow drain extender underneath sidewall spacers deposited in the slot. In one prior art example, after nitride spacers are formed on the inner walls of the slot, thermal oxide is grown in the space between the sidewalls. Next, the nitride spacers are removed and the shallow source/drain junction extenders are implanted into the spaces where the nitride spacers have been removed with the thermal oxide in the center blocking these implants. Next, the nitride spacers are reformed, the center thermal oxide removed, and replaced with a thin gate oxide. Finally, the slot is filled with the gate material. This is a very complicated process which is not very manufacturable.

SUMMARY OF THE INVENTION

The instant invention is a method of fabricating a transistor using selective n+/p+ epitaxial silicon before gate patterning to construct shallow drain extenders for transistors using the Replacement Gate Design. An embodiment of the method of fabricating a transistor comprises the steps: providing a silicon substrate with an upper surface of a first conductivity type; forming a silicon epitaxial layer of a second conductivity type on said upper surface of said silicon substrate surface; forming a disposable gate over a first defined region of said silicon epitaxial layer; forming a plurality of outer sidewall structures adjacent to said disposable gate; forming a plurality of source/drain regions adjacent to said outer sidewall structures; forming an insulator layer over said source/drain regions; removing said disposable gate without substantially removing any other exposed material; forming a plurality of inner sidewall structures adjacent to said outer sidewall structures; removing said silicon epitaxial layer that lies between said inner sidewall structures thereby exposing a portion of said silicon substrate; forming a gate dielectric over said exposed portion of said silicon substrate; and forming a gate electrode over said gate dielectric. The technical advantage of the instant invention will be readily apparent to one skilled in the art from the following FIGUREs, description, and claims.

BRIEF DESCRIPTION OF THE DRAWINGS

In the drawings.

Corresponding numerals and symbols in the different figures refer to corresponding parts unless otherwise indicated.

DETAILED DESCRIPTION OF THE INVENTION

The invention will now be described in conjunction with a replacement gate MOSFET transistor. It will be apparent to those of ordinary skill in the art that the benefits of the invention can be applied to other transistor types. The benefits can also be applied to transistor structures different from that described below, such as those transistors having raised source/drain regions.

Figure 1:
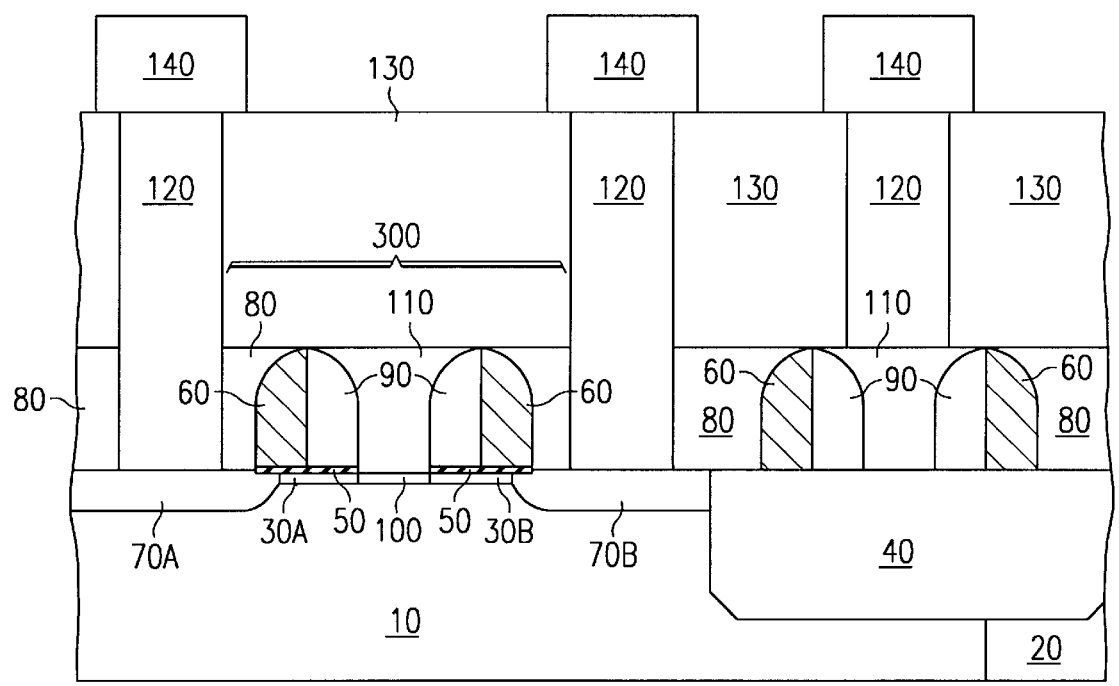
FIG. 1 is a cross-sectional diagram of a transistor showing an embodiment of the instant invention.

A MOSFET transistor 300 formed according to a first embodiment of the instant invention is shown in FIG. 1. MOSFET 300 is formed in a silicon substrate 10 and comprises source/drain extensions 30(a) and 30(b) formed using selective epitaxial silicon layers under the sidewall spacers 60 and 90. The use of selective epitaxial silicon to form the source/drain extensions results in a much reduced junction depth when compared to conventional ion implantation techniques. The source/drain extensions 30(a) and 30(b) are self-aligned to the source and drain regions 70(a) and 70(b) of the MOSFET. A gate dielectric 100 separates the gate electrode 110 from the channel region in the substrate 10. A thermally grown oxide, oxynitride, or deposited gate insulator is preferably used to form the gate dielectric 100 but a high-k dielectric may be used. Gate electrode 110 preferably comprises a low resistance material such as a metal or doped polysilicon. However, other conductive materials, such as amorphous silicon, a non-crystalline silicon, a composite metal-polysilicon or metal-metal, may alternatively be used. Examples include aluminum over titanium-nitride and tungsten over titanium nitride. Gate electrode 110 is also preferably salicided to further reduce sheet resistance if polysilicon is used. In this embodiment, a damascene process is used to remove excess gate conductor material resulting In the gate electrode 110 and the oxide 80 structures shown. Also shown in FIG. 1 is the interlevel dielectric 130 along with contacts 120 and metal conductors 140 connected to the contacts 120.

Figure 2:
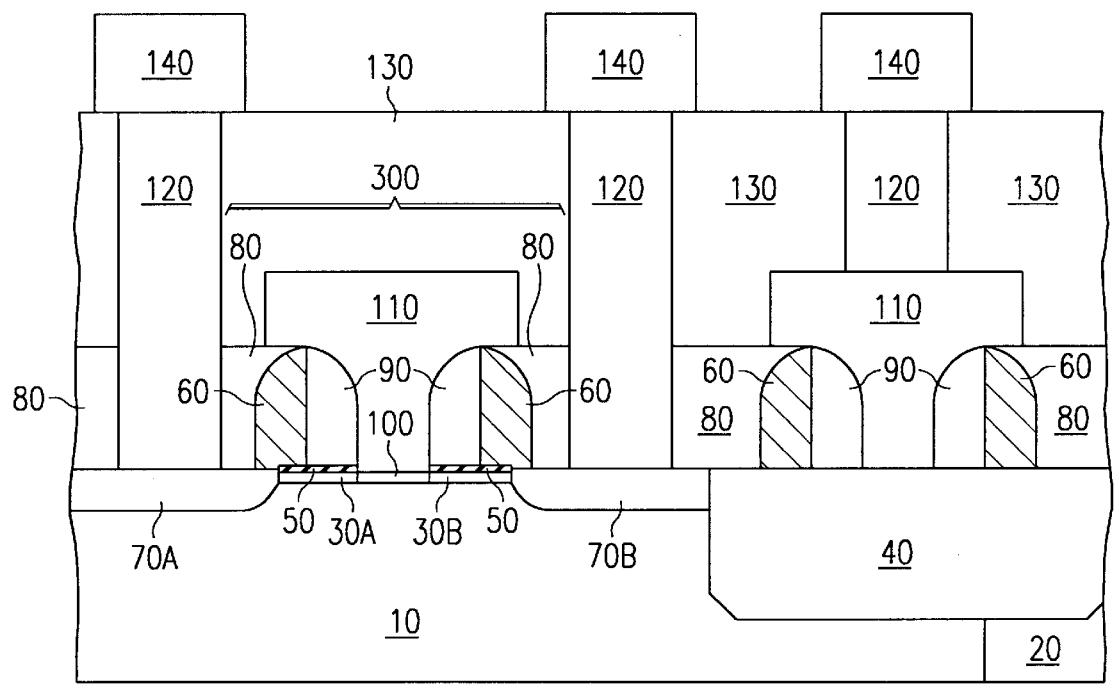
FIG. 2 is a cross-sectional diagram of a transistor showing an alternative embodiment of the instant invention.
Figure 3:
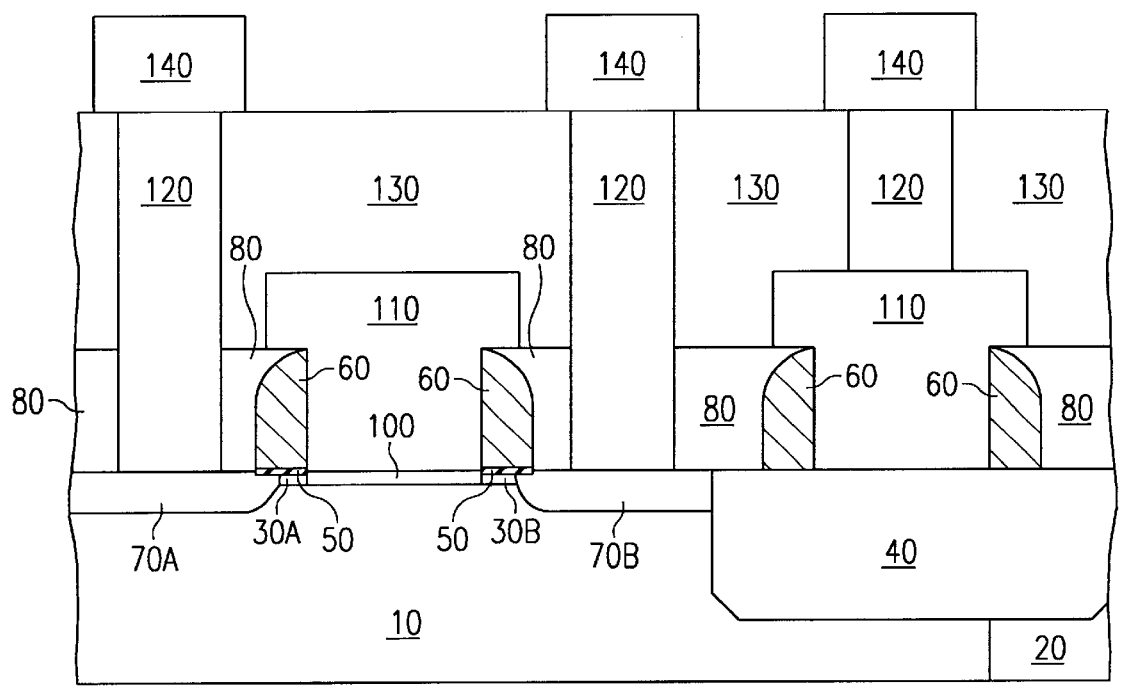
FIG. 3 is a cross-sectional diagram of a transistor showing an alternative embodiment of the instant invention.

Illustrated in FIG. 2 is another embodiment of the instant invention. In this embodiment the gate electrode 110 is patterned and etched resulting in the "T" gate structure 110. FIG. 3 illustrates a further embodiment of the instant invention. Here the sidewall is comprised of structure 60. In this embodiment the gate electrode 110 is patterned and etched instead of polishing (as illustrated in FIG. 1).

Methods for forming shortened gate length transistors according to the embodiments shown in FIG. 1–FIG. 3 will now be described. These methods use CMOS transistor design with n/p doped epitaxial silicon before gate patterning and inner sidewall spacers to form shallow drain extenders for the source and drain regions.

Figure 4A:
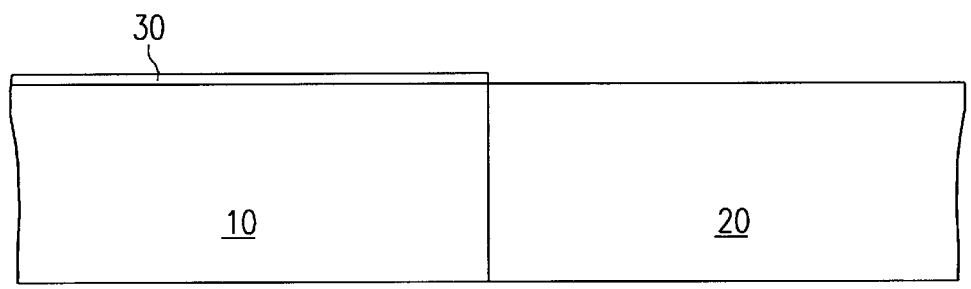
FIGS. 4A–4k are cross-sectional diagrams of partially fabricated transistors at various steps in the fabrication method of the transistors shown in FIGS. 1–3.

Shown in FIG. 4A is portion of a silicon substrate. The regions 10 and 20 represent silicon that has been doped with p-type dopants and n-type dopants respectively. Regions 10 and 20 can be comprised of single-crystal silicon doped by patterned implant and anneal to form CMOS wells in which transistors will be formed. In FIG. 4A a masking layer is formed (not shown), patterned with photoresist, and etched to mask region 20 and expose region 10. After removal of the photoresist remaining after patterning, the masking layer is preferably comprised of oxide, silicon nitride, or photoresist. A selective epitaxial process is performed after region 20 is masked off so as to form a first epitaxial layer of silicon 30 selectively on region 10. The epitaxial layer 30 is heavily doped n-type over the p-type region 10. In some cases the selectivity of the epitaxial process is obtained by controlling the vapor components needed for silicon epitaxy resulting in the formation of the epitaxial layer 30 over region 10 without the formation of any silicon on the masking layer. The epitaxial layer 30 may be 30A–400A thick with a doping concentration of about $1 \times 10^{18}$ cm$^{-3}$ to $1 \times 10^{22}$ cm$^{-3}$. The masking layer is removed resulting in the structure shown in FIG. 4A.

Figure 4B:
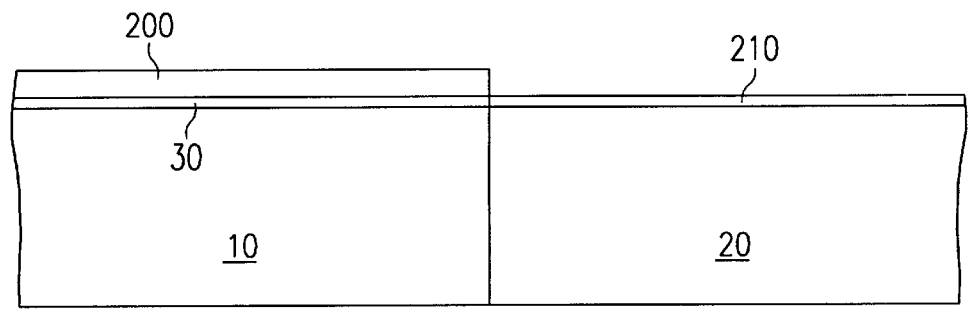

A masking layer 200 is formed, patterned and etched using standard silicon integrated circuit technology to mask the first epitaxial film and expose region 10. The masking layer 200 comprises oxide, silicon nitride; or photoresist. A selective epitaxial process is performed to form an epitaxial layer of silicon 210 selectively on region 20. The second epitaxial layer 210 is heavily doped p-type over the n-type region 20. The epitaxial layer 210 may be 30A–400A thick with a doping concentration of about $1 \times 10^{18}$ cm$^{-3}$ to $1 \times 10^{22}$ cm$^{-3}$. The resulting structure is shown in FIG. 4B.

Figure 4C:
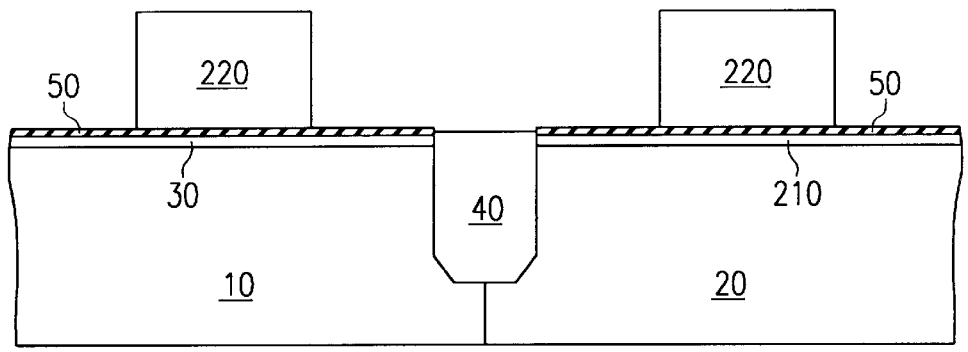
Figure 4D:
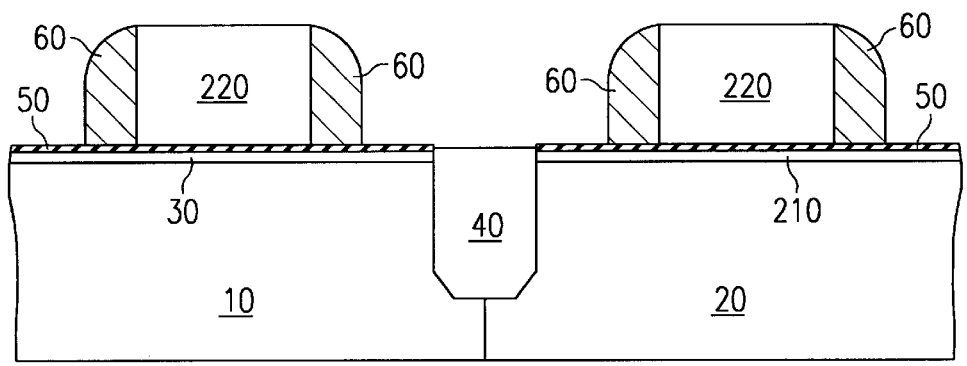

After removal of the second masking layer 200, an isolation region 40 is formed in the silicon substrate as illustrated in FIG. 4c. The isolation region 40 can be formed using LOCOS isolation technology or Shallow Trench Isolation (STI) technology. If LOCOS isolation is used, the region 40 will be comprised of silicon dioxide. If STI isolation is used the isolation region 40 could be a chemical vapor deposited (CVD) silicon oxide, PECVD TEOS, HOP Oxide, oxynitride or any insulating material with similar properties. Both methods are standard in the integrated circuit technology art. In either case, the Isolation process removes any regions of mis-aligned doped epitaxial silicon. After isolation region 40 is formed, a dummy layer 50 is formed on all exposed silicon surfaces. This dummy layer 50 could comprise a silicon dioxide, silicon nitride, or a silicon oxynitride film. A disposable gate layer is formed, patterned and etched resulting in structure 220 shown in FIG. 40. The disposable gate layer 220 could be comprised of polysilicon, amorphous silicon, crystalline silicon or silicon nitride. The choice of disposable gate material will result in alternate embodiments of the instant invention. For the embodiment where the disposable gate layer 220 is silicon nitride, a conformal sidewall layer is formed and anisotropically etched to form the outer sidewall structures 60 shown in FIG. 4D. For the case of silicon nitride disposable gates 220, the sidewall layer (an thus sidewalls 60) will preferably be silicon oxide. The source and drain areas 70 and 230, are implanted in two patterning steps and then annealed.

Figure 4E:
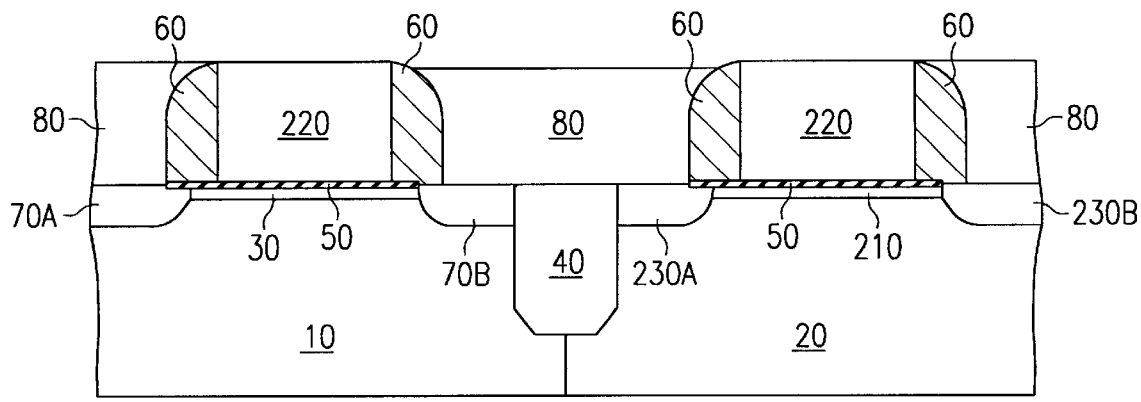

Referring to FIG. 4E, the source and drain areas 70(a) and 70(b) will be implanted with one or more n-type dopants. These n-type dopants may be comprised of As, P, Sb, or any combination thereof. The p-type dopants implanted to form region 230(a) and 230(b) may be comprised of B, In, or any boron containing species. If it is necessary to form a suicide film on the source and drain junction regions 70(a) and 70(b) and 230(a) and 230 (b), it should preferably be performed after the anneal of the source and drain Implanted regions 70(a) and 70(b) and 230(a) and 230(b). Following the formation of the source and drain regions 70(a) and 70(b) and 230(a) and 230(b), (and any silicide layer if necessary) an insulator layer 80 is deposited and planarized to form the structure shown in FIG. 4E. The insulator layer could be a chemical vapor deposited (CVD) silicon oxide, PECVD TEOS, HDP Oxide, or any insulating material with similar properties. The planarization of the insulator layer could be performed using chemical mechanical polishing or plasma etching and should uncover the top surface of the disposable gate structures 220.

A preferential etch is performed to remove the disposable gate layer 220 without attacking the outer sidewall spacer. For the embodiment with silicon nitride disposable gates 220 and silicon oxide sidewalls 60, a selective etch such as a hot phosphoric acid based etch could be used. The etch should preferentially etch the disposable gate structure 220 without attacking any other exposed surface, substrate or sidewall structures. The resulting structure is shown in FIG. 4F.

Figure 4F:
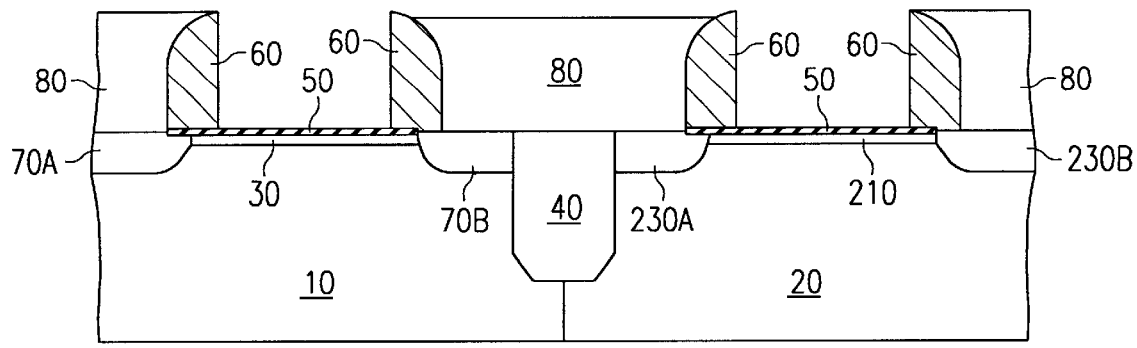
Figure 4G:
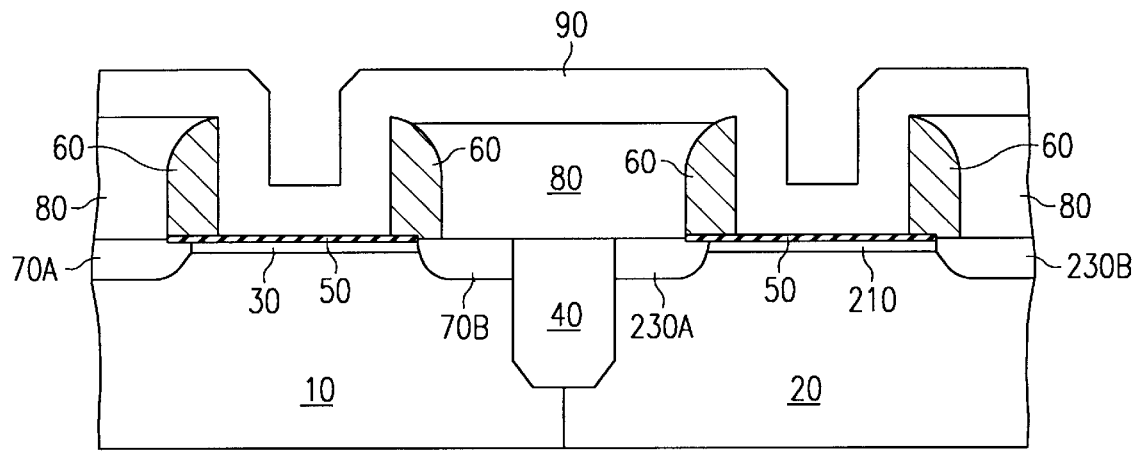

From the structure shown in FIG. 4F, alternate embodiments of the instant invention depend on whether an inner sidewall structure is formed. For the embodiment where an inner sidewall structure is formed, a conformal inner sidewall layer 90 is deposited as illustrated in FIG. 4G. The layer is etched using a process with a high degree of anisotropy to form the inner sidewall structures 90 shown in FIG. 4H. These inner sidewall structures 90 serve to narrow the slot opening and permits making transistor gates with linewidths smaller than can be patterned by lithography. For an embodiment of the instant invention, the inner sidewall 90 is silicon nitride.

Figure 4H:
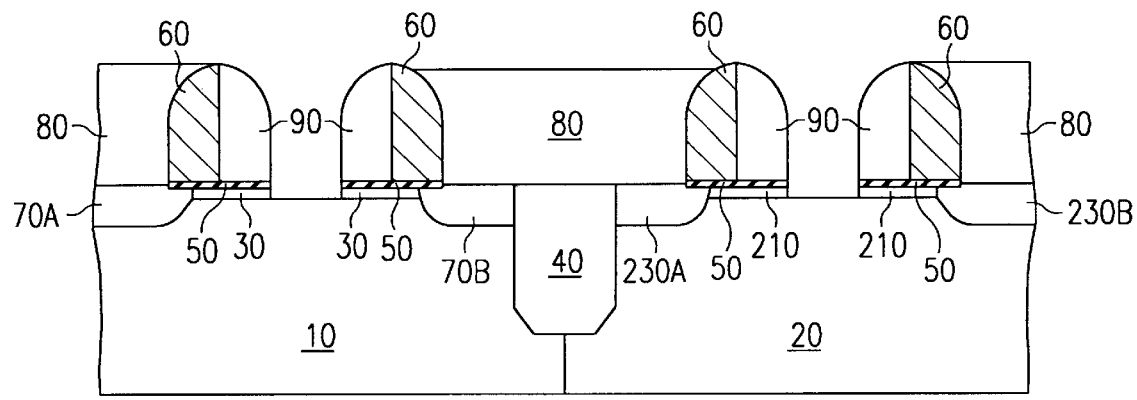

A selective etching process is used to remove the dummy layer 50 between the inner sidewall structures 90 without significantly affecting the exposed surfaces on the substrate. A silicon etch is then used to remove the exposed areas of the layers 30 and 210 that exist between the inner sidewall structures 90. It is important to etch effectively through the entire thickness of both layers 30 and 210 with the same etch. This etch could be a wet etch that has a much faster etch-rate for heavily doped silicon therefore leaving the silicon beneath the heavily doped epitaxial layers 30 and 210 substantially unetched. Another embodiment comprises using a plasma etch with monitoring of the etched species in vapor form to detect when the heavily doped epitaxial layers 30 and 210 have been removed. In yet another embodiment, a timed plasma etch could be used. It is critical that all of the portions of layers 30 and 210 situated between sidewalls 90 is removed during this step. To ensure the complete removal of these layers, some over etching of the underlying silicon substrate is permitted. This structure is shown in FIG. 4H.

Figure 4I:
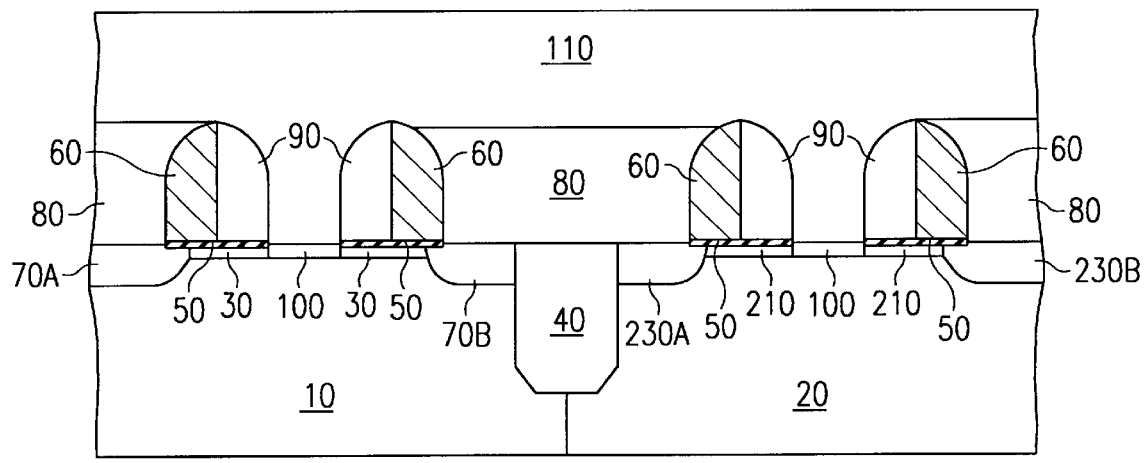

A gate dielectric 100 is formed in the region between the inner sidewall 90 as illustrated in FIG. 4I. This gate dielectric could be comprised of silicon oxide, silicon oxynitride, silicon nitride, a high-k dielectric or any combination thereof. It could also be comprised of alternating layers of silicon oxide, silicon oxynitride and silicon nitride. A replacement gate 110 layer is formed above the gate dielectric as shown in FIG. 4I. This replacement gate 110 could be comprised of polysilicon, amorphous silicon, a combination of polygermanium and polysilicon, or a metal. If a metal is used, the preferred choices would be a metal with a work function intermediate to that for n-type and p-type silicon or with one metal having a work function similar to n-type polysilicon for NMOS devices and another metal with a work function similar to p-type polysilicon for PMOS devices. If polysilicon is used, it should be doped during deposition or formation. The most likely choices for doping would be dopants causing the polysilicon to be n-type. This would necessitate the proper design of the PMOS transistors for operation as buried channel transistors.

Figure 4J:
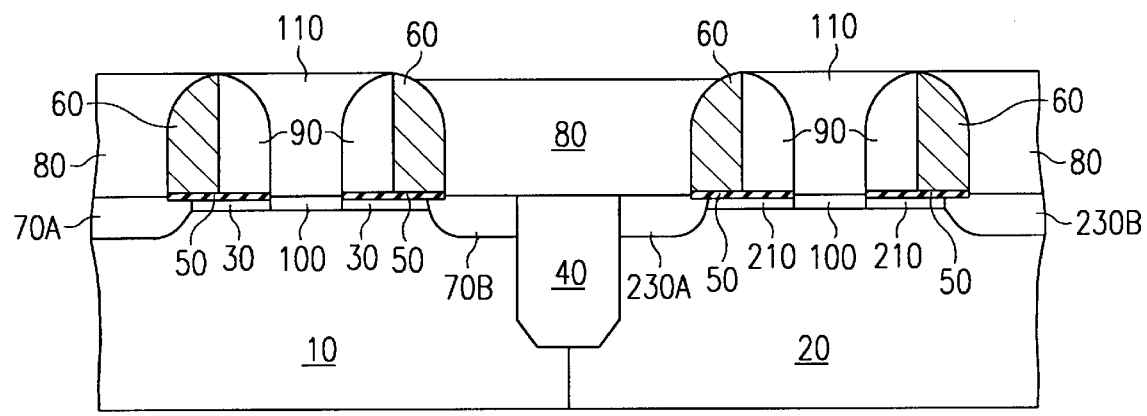
Figure 4K:
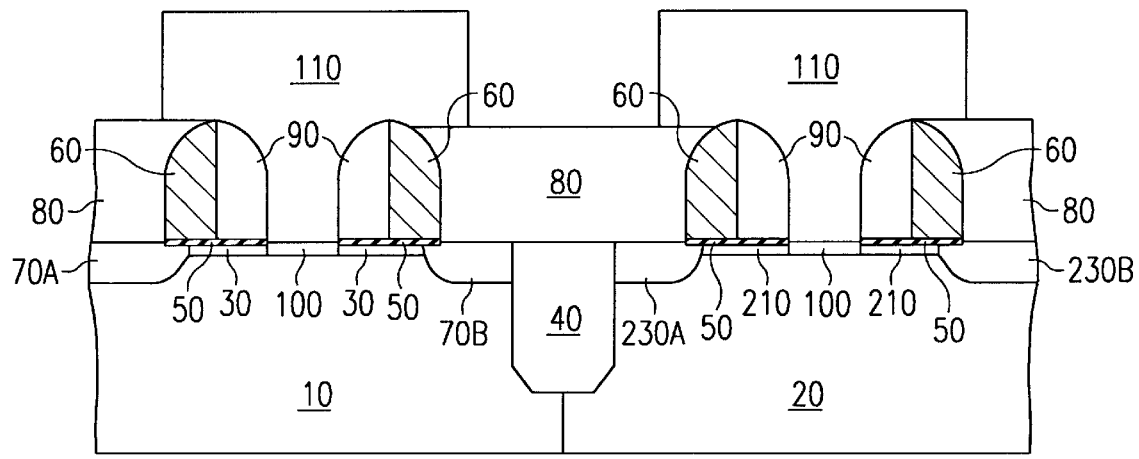

Shown in FIG. 4J and FIG. 4K are alternate embodiments of the instant invention. In FIG. 4J, CMP is used to remove the replacement gate material everywhere but in the slots left by the removal of the disposable gate layer. In FIG. 4K, the replacement gate material is patterned and etched using standard integrated circuit technology. Standard processing techniques are then used to complete the fabrication of the integrated circuit.

Figure 5:
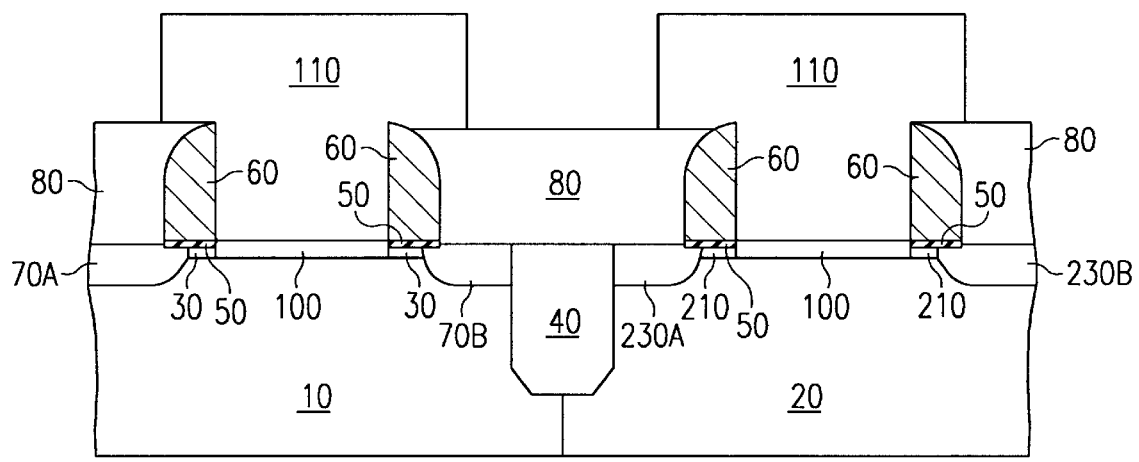
FIG. 5 is a cross-sectional diagram of a transistor showing an alternative embodiment of the instant invention.

Shown in FIG. 5 is an alternate embodiment of the instant invention. In this method, the steps used to form the inner sidewall structures (90 in FIG. 4J) are eliminated. In this embodiment, the epitaxial layers 30 and 210 are self aligned with the outer sidewall 60 during the epitaxial etch step.

In the above embodiments, the disposable gate 220 was silicon nitride, and the outer sidewall structure 60 was silicon oxide. In another embodiment, the disposable gate 220 can be formed from single crystal silicon, polysilicon, or amorphous silicon. In this embodiment the outer sidewall structures 60 can be formed using silicon nitride, or silicon oxide. In this embodiment silicon nitride is preferred for the outer sidewall structure 60. For polysilicon disposable gates 220, a chlorine based etched is used to remove the disposable gate structures 220. This etch will not react with silicon oxide or silicon nitride. In this embodiment silicon nitride is used for the inner sidewall structure 90 if present.

In all the above described embodiments, processing then continues with the formation of interconnections between the above described structures and other devices (not shown) as is known in the art.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For instance, masked low energy ion implantation could be used instead of selective epitaxial deposition of silicon to form regions 30 and 210 that will form the shallow drain extenders underneath the sidewall spacers. It is therefore intended that the appended claims encompass any such modifications or embodiments.

I claim:

1. A method of fabricating a transistor, comprising the steps of:

providing a silicon substrate with an upper surface of a first conductivity type;

forming a silicon epitaxial layer of a second conductivity type on said upper surface of said silicon substrate surface;

forming a disposable gate over a first defined region of said silicon epitaxial layer;

forming a plurality of outer sidewall structures adjacent to said disposable gate;

forming a plurality of source/drain regions adjacent to said outer sidewall structures;

forming an insulator layer over said source/drain regions;

removing said disposable gate without substantially removing any other exposed material;

forming a plurality of inner sidewall structures adjacent to said outer sidewall structures;

removing said silicon epitaxial layer that lies between said inner sidewall structures thereby exposing a portion of said silicon substrate;

forming a gate dielectric over said exposed portion of said silicon substrate; and forming a gate electrode over said gate dielectric.

2. The method of claim 1 wherein said disposable gate layer comprises a material selected from the group consisting of: polysilicon, amorphous silicon, crystalline silicon and silicon nitride.

3. The method of claim 1 wherein said outer sidewall structure comprises a material selected from the group consisting of: silicon oxide. silicon nitride, and silicon oxynitride.

4. The method of claim 1 wherein said forming a plurality of source/drain regions further comprises the steps of:

implanting a dopant species into said silicon substrate adjacent to said plurality of outer sidewall structures; and annealing said silicon substrate.

5. The method of claim 1 wherein said insulator layer comprises a material selected from the group consisting of: silicon oxide, CVD silicon oxide, PECVD TEOS, and HDP Oxide.

6. The method of claim 1 wherein said inner sidewall structure comprises a material selected from the group consisting of: silicon oxide and silicon nitride.

7. The method of claim 1 wherein said forming said gate dielectric comprises growing a dielectric film.

8. The method of claim 1 wherein said forming said gate dielectric comprises depositing a dielectric film.

9. The method of claim 1 wherein said gate dielectric comprises a material selected from the group consisting of: silicon oxide, silicon oxynitride, and silicon nitride.

10. The method of claim 1 wherein said forming said gate dielectric further comprises the steps of:
  forming a gate electrode film on said gate dielectric such that the surface of said gate electrode film is above the surface of said insulator layer; and
  patterning and etching said gate electrode film to form said gate electrode.

11. The method of claim 1 wherein said forming said gate dielectric further comprises the steps of:
  forming a gate electrode film on said gate dielectric such that the surface of said gate electrode film is above the surface of said insulator layer; and
  planarizing said gate electrode film using a chemical mechanical polish such that the surface of the gate electrode is about the same level as the surface of the insulator layer.

12. The method of claim 1 wherein said gate electrode comprises a material selected form the group consisting of:
  polysilicon, amorphous silicon, polygermanium, and a metal.

13. A method of fabricating a transistor, comprising the steps of:
  providing a silicon substrate with an upper surface of a first conductivity type;
  forming a silicon epitaxial layer of a second conductivity type on said upper surface of said silicon substrate surface;
  forming disposable gate over a first defined region of said silicon epitaxial layer;
  forming a plurality of outer sidewall structures adjacent to said disposable gate;
  forming a plurality of source/drain regions adjacent to said outer sidewall structures;
  forming an insulator layer over said source/drain regions;
  removing said disposable gate without substantially removing any other exposed material;
  removing said silicon epitaxial layer that lies between said outer sidewall structures thereby exposing a portion of said silicon substrate;
  forming a gate dielectric over said exposed portion of said silicon substrate; and
  forming a gate electrode over said gate dielectric.

14. The method of claim 13 wherein said disposable gate layer comprises a material selected from the group consisting of: polysilicon, amorphous silicon, crystalline silicon and silicon nitride.

15. The method of claim 13 wherein said outer sidewall structure comprises a material selected from the group consisting of: silicon oxide, silicon nitride, and silicon oxynitride.

16. The method of claim 14 wherein said forming a plurality of source/drain regions further comprises the steps of:
  implanting a dopant species into said silicon substrate adjacent to said plurality of outer sidewall structures; and
  annealing said silicon substrate.

17. The method of claim 13 wherein said insulator layer comprises a material selected from the group consisting of: silicon oxide, CVD silicon oxide, PECVD TEOS, and HDP Oxide.

18. The method of claim 13 wherein said forming said gate dielectric comprises growing a dielectric film.

19. The method of claim 13 wherein said forming said gate dielectric comprises depositing a dielectric film.

20. The method of claim 13 wherein said gate dielectric comprises a material selected from the group consisting of:
  silicon oxide, silicon oxynitride, and silicon nitride.

21. The method of claim 13 wherein said forming said gate dielectric further comprises the steps of:
  forming a gate electrode film on said gate dielectric such that the surface of said gate electrode film is above the surface of said insulator layer; and
  patterning and etching said gate electrode film to form said gate electrode.

22. The method of claim 13 wherein said forming said gate dielectric further comprises the steps of:
  forming a gate electrode film on said gate dielectric such that the surface of said gate electrode film is above the surface of said insulator layer; and
  planarizing said gate electrode film using a chemical mechanical polish such that the surface of the gate electrode is about the same level as the surface of the insulator layer.

23. The method of claim 13 wherein said gate electrode comprises a material selected form the group consisting of:
  polysilicon, amorphous silicon, polygermanium, and a metal.

24. A method of fabricating a transistor, comprising the steps of:
  providing a silicon substrate with an upper surface of a first conductivity type;
  forming a silicon epitaxial layer of a second conductivity type on said upper surface of said silicon substrate surface;
  forming a disposable gate over a first defined region of said silicon epitaxial layer;
  removing said disposable gate without substantially removing any other exposed material;
  removing said silicon epitaxial layer that is substantially exposed by said removing of said disposable gate thereby exposing a region of said silicon substrate;
  forming a gate dielectric over said exposed region of said silicon substrate; and
  forming a gate electrode over said gate dielectric.

25. The method of claim 24 wherein said disposable gate layer comprises a material selected from the group consisting of: polysilicon, amorphous silicon, crystalline silicon and silicon nitride.

26. The method of claim 24 wherein said forming said gate dielectric comprises growing a dielectric film.

27. The method of claim 24 wherein said forming said gate dielectric comprises depositing a dielectric film.

28. The method of claim 24 wherein said gate dielectric comprises a material selected from the group consisting of:
  silicon oxide, silicon oxynitride, and silicon nitride.

29. The method of claim 24 wherein said forming said gate dielectric further comprises the steps of:
  forming a gate electrode film on said gate dielectric such that the surface of said gate electrode film is above the surface of said insulator layer; and
  patterning and etching said gate electrode film to form said gate electrode.

30. The method of claim 24 wherein said forming said gate dielectric further comprises the steps of:
  forming a gate electrode film on said gate dielectric such that the surface of said gate electrode film is above the surface of said insulator layer; and
  planarizing said gate electrode film using a chemical mechanical polish such that the surface of the gate electrode is about the same level as the surface of the insulator layer.

31. The method of claim 24 wherein said gate electrode comprises a material selected form the group consisting of: polysilicon, amorphous silicon, polygermanium, and a metal.

* * * * *